(12) United States Patent
Kill et al.

(10) Patent No.: US 9,113,276 B2
(45) Date of Patent: Aug. 18, 2015

(54) AUTOMATIC RECONFIGURATION OF A HEARING ASSISTANCE DEVICE BASED ON BATTERY CHARACTERISTICS

(71) Applicant: Starkey Laboratories, Inc., Eden Prairie, MN (US)

(72) Inventors: Howard Kill, Eden Prairie, MN (US); James R. Newton, Burnsville, MN (US); Zheng Yan, Eden Prairie, MN (US); Harikrishna P. Natarajan, Shakopee, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 0 days.

(21) Appl. No.: 13/707,409

(22) Filed: Dec. 6, 2012

(65) Prior Publication Data

US 2013/0259278 A1 Oct. 3, 2013

Related U.S. Application Data (60) Provisional application No. 61/616,402, filed on Mar. 27, 2012.

(51) Int. Cl.
*H04R 25/00* (2006.01)

(52) U.S. Cl.
CPC ............ *H04R 25/602* (2013.01); *H04R 25/305* (2013.01)

(58) Field of Classification Search
CPC .......... H04R 1/10; H04R 25/30; H04R 25/60; H04R 25/305; H04R 25/543; H04R 2225/025; H04R 2225/61; H04R 5/505; H04R 2460/03; H04R 2225/41; H04R 25/602; H04R 25/453; G01R 31/36; G01R 19/165; G01R 31/3665

USPC ............ 381/58, 60, 312, 314, 317–318, 321, 381/323, 328; 320/160, 106; 607/55–57; 600/25

See application file for complete search history.

(56) References Cited

U.S. PATENT DOCUMENTS 5,237,257 A * 8/1993 Johnson et al. ............... 320/106
5,661,814 A    8/1997 Kalin et al.
(Continued)

FOREIGN PATENT DOCUMENTS

EP    0394074 A2    10/1990

OTHER PUBLICATIONS

"European Application Serial No. 13161446.3, Extended European Search Report mailed Feb. 18, 2015", 7 pgs.

*Primary Examiner* — Curtis Kuntz
*Assistant Examiner* — Sabrina Diaz
(74) *Attorney, Agent, or Firm* — Schwegman Lundberg & Woessner, P.A.

(57) ABSTRACT

Disclosed herein, among other things, are methods and apparatus for detecting battery chemistry or battery type and reconfiguring a hearing assistance device based on the detected battery. One aspect of the present subject matter relates to a method of operating a hearing assistance device having a battery. A voltage of the battery is detected at a predetermined load current and a battery chemistry or battery type is determined based on the detected voltage. An operating parameter of the hearing assistance device is adjusted based on the determined battery chemistry or battery type, in various embodiments. Examples of adjustments made based on the determined battery chemistry or battery type include gain, feedback cancellation (FBC) filter, self-diagnostic thresholds of the hearing assistance device, indicator loudness, low battery set point, or an end-of-discharge battery set point.

28 Claims, 6 Drawing Sheets

(56) References Cited

U.S. PATENT DOCUMENTS

| | | |
|---|---|---|
| 7,274,168 B2 | 9/2007 | Tskukamoto et al. |
| 7,315,626 B2 | 1/2008 | Pedersen |
| 7,349,549 B2 | 3/2008 | Bachler et al. |
| 7,382,270 B2 * | 6/2008 | Wendelrup et al. ........ 340/636.1 |
| 7,557,540 B2 * | 7/2009 | Kao et al. ...................... 320/132 |
| 2005/0111679 A1 * | 5/2005 | Husung ......................... 381/312 |
| 2005/0259838 A1 | 11/2005 | Barthel et al. |
| 2007/0126402 A1 * | 6/2007 | Tsai et al. ..................... 320/134 |
| 2007/0170893 A1 | 7/2007 | Kao et al. |
| 2009/0257610 A1 | 10/2009 | Wu et al. |
| 2013/0272556 A1 * | 10/2013 | Hamacher .................... 381/328 |

* cited by examiner

AUTOMATIC RECONFIGURATION OF A HEARING ASSISTANCE DEVICE BASED ON BATTERY CHARACTERISTICS

CLAIM OF PRIORITY

The present application claims the benefit under 35 U.S.C. §119(e) of U.S. Provisional Patent Application Ser. No. 61/616,402, filed Mar. 27, 2012, which is incorporated herein by reference in its entirety.

FIELD OF THE INVENTION

The present subject matter relates generally to hearing assistance devices, and in particular to detecting battery chemistry or battery type and reconfiguring a hearing assistance device based on the detected battery.

BACKGROUND

Modern hearing assistance devices, such as hearing aids, typically include digital electronics to enhance the wearer's listening experience. Hearing aids are electronic instruments worn in or around the ear that compensate for hearing losses by specially amplifying sound. Hearing aids use transducer and electro-mechanical components which are connected via wires to the hearing aid circuitry.

Components in a hearing aid require some amount of electrical power to function as desired. Usually, a battery is used to provide power to all of the components in a hearing aid. The size and weight of the battery can be a limiting factor in the overall design of the hearing aid. In addition, the battery typically has a finite life expectancy, requiring frequent recharging or replacement and disposal.

Some hearing assistance devices are capable of operation with more than one type of battery. Batteries with different chemistries can have different charging and discharging voltage characteristics. These different voltage characteristics can affect hearing assistance device performance, as some hearing assistance device functions are based on the provided input voltage from the battery. What is needed in the art is an improved system for battery detection and corresponding device reconfiguration for hearing assistance devices, to provide consistent device performance while accepting multiple types of batteries.

SUMMARY

Disclosed herein, among other things, are methods and apparatus for detecting battery chemistry or battery type and reconfiguring a hearing assistance device based on the detected battery chemistry or battery type.

One aspect of the present subject matter relates to a method of operating a hearing assistance device having a battery. A voltage of the battery is detected at a predetermined load current and a battery type or battery chemistry is determined based on the detected voltage. An operating parameter of the hearing assistance device is adjusted based on the determined battery type or battery chemistry, in various embodiments. Examples of adjustments made based on the determined battery type or battery chemistry include gain, feedback cancellation (FBC) filter, adaptation rate, self-diagnostic thresholds of the hearing assistance device, indicator loudness, low battery set point, or an end-of-discharge battery set point.

Another aspect of the present subject matter relates to a hearing assistance device including a microphone, hearing assistance electronics connected to the microphone, a receiver connected to the hearing assistance electronics, and a battery connected to at least the hearing assistance electronics. The hearing assistance electronics include a digital signal processor (DSP) configured to detect voltage of the battery at a predetermined load current, determine battery type or battery chemistry based on the detected voltage, and adjust an operating parameter of the hearing assistance device based on the determined battery type or battery chemistry.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

DETAILED DESCRIPTION

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

The present subject matter relates generally to methods and apparatus for detecting battery type or battery chemistry and reconfiguring a hearing assistance device based on the detected battery type or battery chemistry. The hearing assistance devices referred to herein include, but are not limited to hearing aids. A hearing aid's gain and output changes with power supply voltage, since the output stage and receiver of a hearing aid are typically not powered from a regulated power supply, but on raw battery power. A typical hearing aid battery, such as a Zn-Air battery, has a flat, low voltage discharge curve. Hearing aid functions and fitting system simulations are designed for this type of battery. New, high-performance rechargeable battery technology is available that is size compatible with currently-used Zn-Air cells, allowing interchangeable use of primary and secondary batteries. One problem with using these batteries, such as Ag—Zn batteries, is a unique 2-step discharge curve that starts at a higher voltage than Zn-Air, and then rapidly transitions to a lower voltage more compatible with standard hearing aid operation. This second lower voltage stage is still higher than the more typically used primary cells (such as Zn-Air) or other commonly used rechargeable cells (such as NiMH). One of the effects of the Ag—Zn battery characteristic is its effect upon gain output and distortion of the hearing aid audio processing. The output stage of the hearing aid amplifier is unregulated, so changes in battery voltage cause corresponding changes in gain and maximum output. At higher voltage, gain and output increases, by 3 dB in an embodiment, and distortion at high input levels increases. After the voltage transition, hearing aid operation returns to near, but still higher than normal levels (about 1 dB over Zn-Air levels, in an embodiment).

Another effect of the Ag—Zn voltage characteristic is reduction in performance of the feedback canceller (FBC) when operating in a non-adaptive or slow-adaptive hearing aid mode. The increased output sensitivity results in an increased feedback transfer function. The feedback canceller filter adjusts to match this leakage, which will cause problems when working with a static or very slow adapting FBC. Thus, any hearing aid processing that depends upon acoustic output, which is voltage-dependent, is vulnerable to performance alteration and degradation based on battery voltage characteristics. In addition, other functions that depend on unregulated battery voltage may be susceptible to degradation. Thus, a hearing assistance device will not match its published specifications (which are obtained using Zn-Air or NiMH batteries) using an Ag—Zn battery. Under certain circumstances, a hearing assistance device wearer (or patient) may notice increased distortion, changes in gain and output during the transition period, increase feedback in a non-adaptive FBC mode, false alarms or misses when running hearing aid self-diagnostics, indicators not playing at desired levels, and increased volume at full charge.

Disclosed herein, among other things, are methods and apparatus for detecting battery chemistry or battery type and reconfiguring a hearing assistance device based on the detected battery chemistry or battery type. The present subject matter detects battery voltage and/or battery chemistry and/or battery type at power up of a hearing assistance device. It then adjusts the gain and maximum output limit of the hearing aid to compensate for cell voltage (and state of charge). In one embodiment, the subject matter is embodied in firmware of the device. Using the present subject matter, hearing aid gain, output and distortion can become the same or similar regardless of battery type or battery chemistry. The present subject matter provides for proper hearing assistance device operating characteristics when using batteries having stepped discharge characteristics. Additional adjustments are made based on detected battery chemistry or battery type, such as FBC filters, self-diagnostic thresholds, and indicator loudness, in various embodiments. The present subject matter can also compensate for other characteristics that change over voltage, some due to gain and output. Examples include noise, clock frequency, digital interface voltage levels and in-situ real ear measurements.

Figure 1:
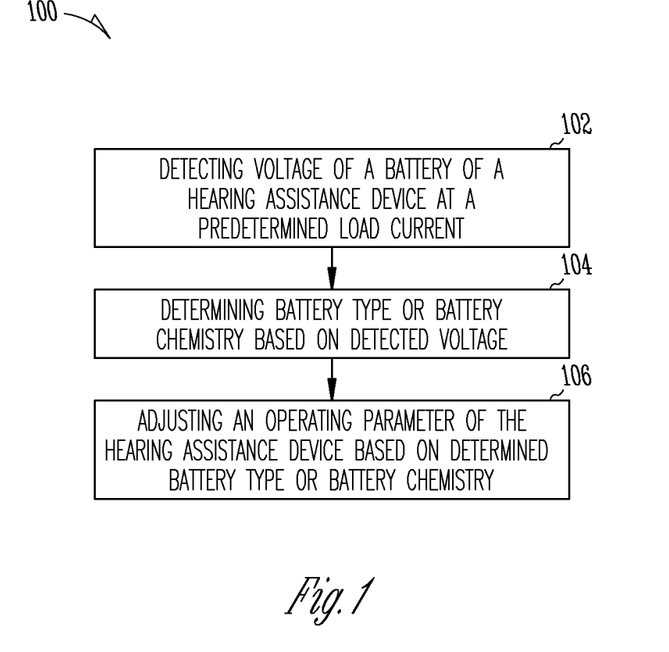
FIG. 1 illustrates a flow diagram of a method of operating a hearing assistance device having a battery, according to one embodiment of the present subject matter.

FIG. 1 illustrates a flow diagram of a method 100 of operating a hearing assistance device having a battery, according to one embodiment of the present subject matter. At 102, a voltage of the battery is detected at a predetermined load current and a battery chemistry or battery type is determined based on the detected voltage, at 104. An operating parameter of the hearing assistance device is adjusted based on the determined battery chemistry or battery type at 106, in various embodiments. Examples of adjustments made based on the determined battery type or battery chemistry include gain, feedback cancellation (FBC) filter, adaptation rate, self-diagnostic thresholds of the hearing assistance device, indicator loudness, low battery set point, or an end-of-discharge battery set point. In addition, as shown in FIGS. 2 and 3A-3B, other adjustments can be made based on determined battery type or battery chemistry, without departing from the scope of this disclosure.

Figure 2:
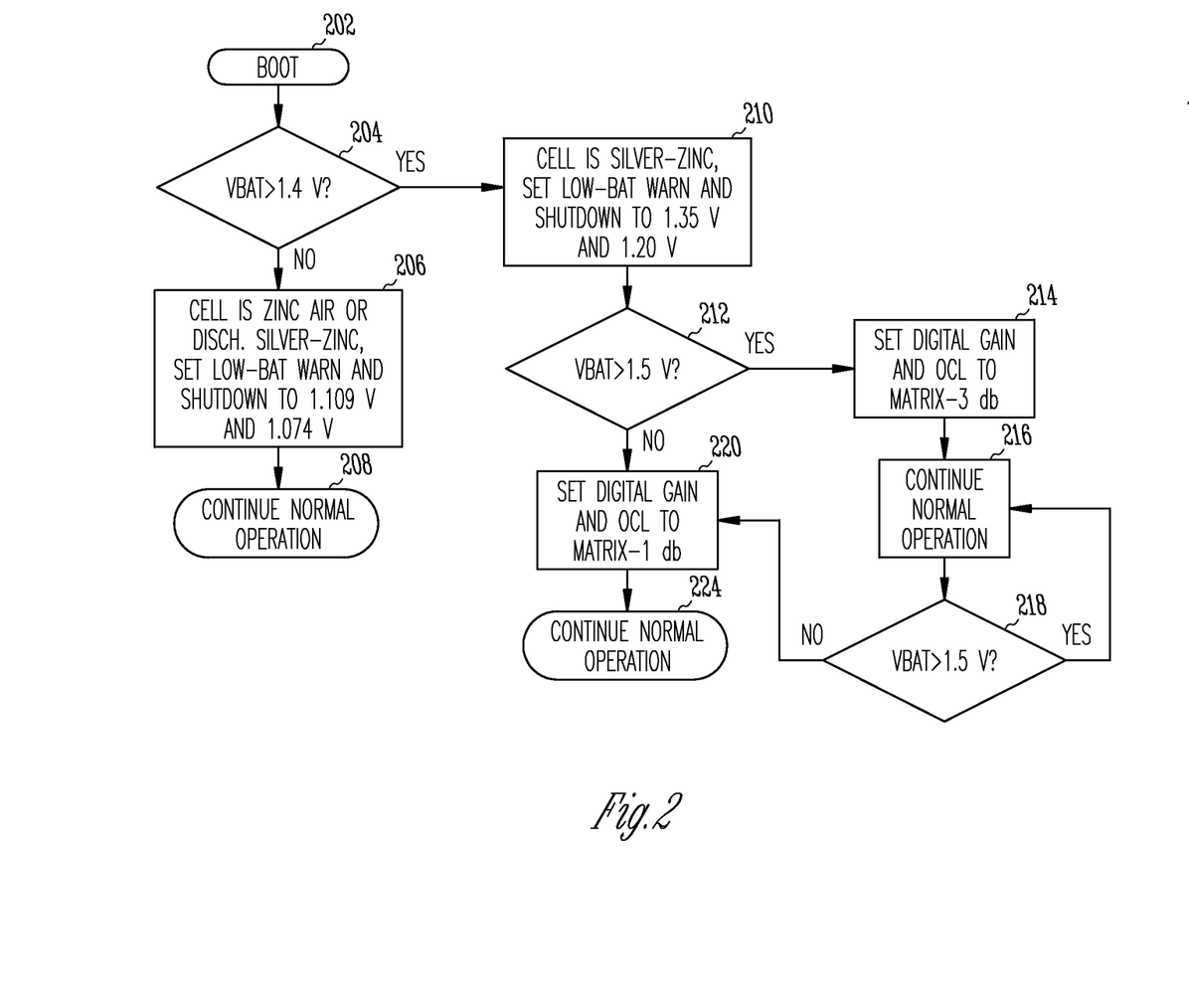
FIG. 2 illustrates a flow diagram of a method for adjusting a hearing assistance device based on battery type or battery chemistry, according to one embodiment of the present subject matter.
Figure 3A:
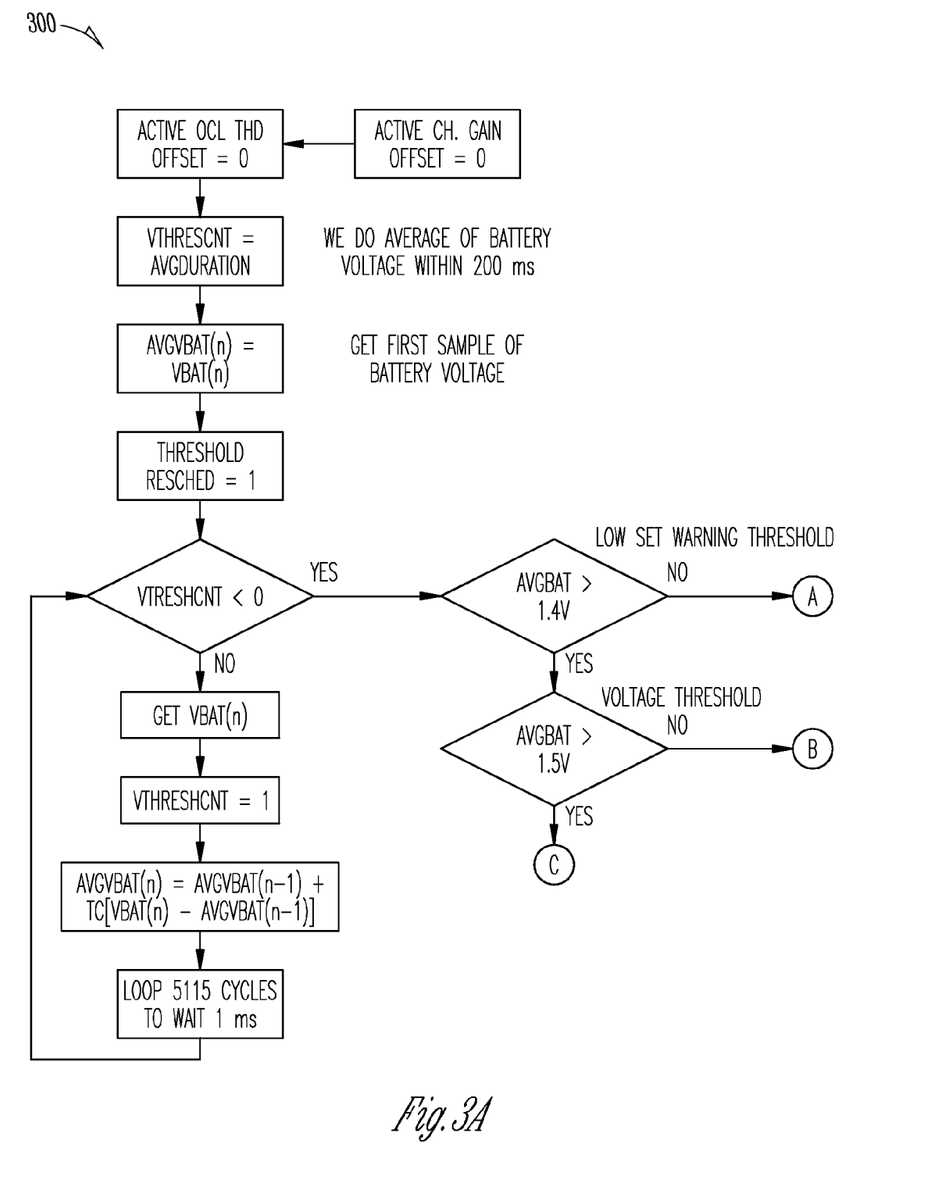
FIGS. 3A-3B illustrate a flow diagram of a method for operating a hearing assistance device low battery threshold, according to various embodiments of the present subject matter.
Figure 3B:
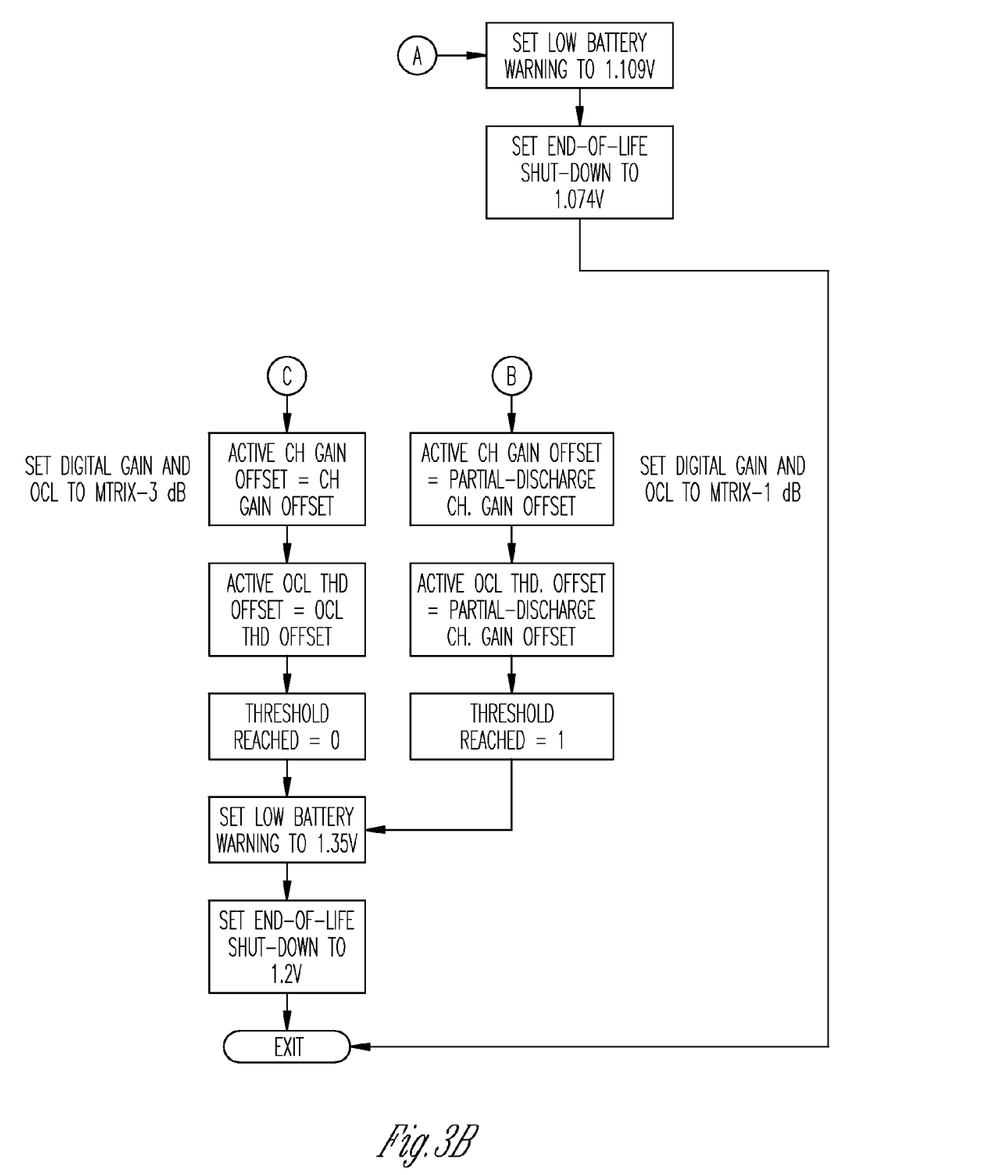

FIG. 2 illustrates a flow diagram of a method 200 for adjusting a hearing assistance device based on battery type or battery chemistry, according to one embodiment of the present subject matter. At power up of the device 202, the voltage of the battery at a low load condition is measured at 204. If the battery voltage is below a programmable threshold, at 206 the battery cell is determined to be Zn-Air or discharged AgZn, and the low battery warning level and shutdown level are set to predetermined levels (1.109 V and 1.074 V in the depicted embodiment). Normal device operation continues at 208. If the battery voltage is above the programmable threshold (1.4V in the depicted embodiment), at 210 the battery cell is determined to be AgZn, and the low battery warning level and shutdown levels are set to predetermined levels (1.35 V and 1.2 V in the depicted embodiment). If the battery voltage is above a second predetermined level (1.5 V in the depicted embodiment) at 212, digital gain and output control level (OCL) are set for the device at 214, normal operation continues at 216, and battery voltage is rechecked at 218. If battery voltage remains above the second predetermined level, normal operation continues. If battery voltage is less than or equal to the second predetermined level, digital gain and OCL are set for the device at 220, and normal operation continues at 224. Additional comparisons compensate for the multiple-step discharge characteristic of certain batteries, such as AgZn batteries in an embodiment. FIGS. 3A-3B illustrate a flow diagram of a method 300 for operating a hearing assistance device to set low battery threshold level, according to various embodiments of the present subject matter. The method includes multiple sampling of battery voltage, comparisons to thresholds, and setting of low battery warning thresholds based on the comparisons, as depicted.

Figure 4:
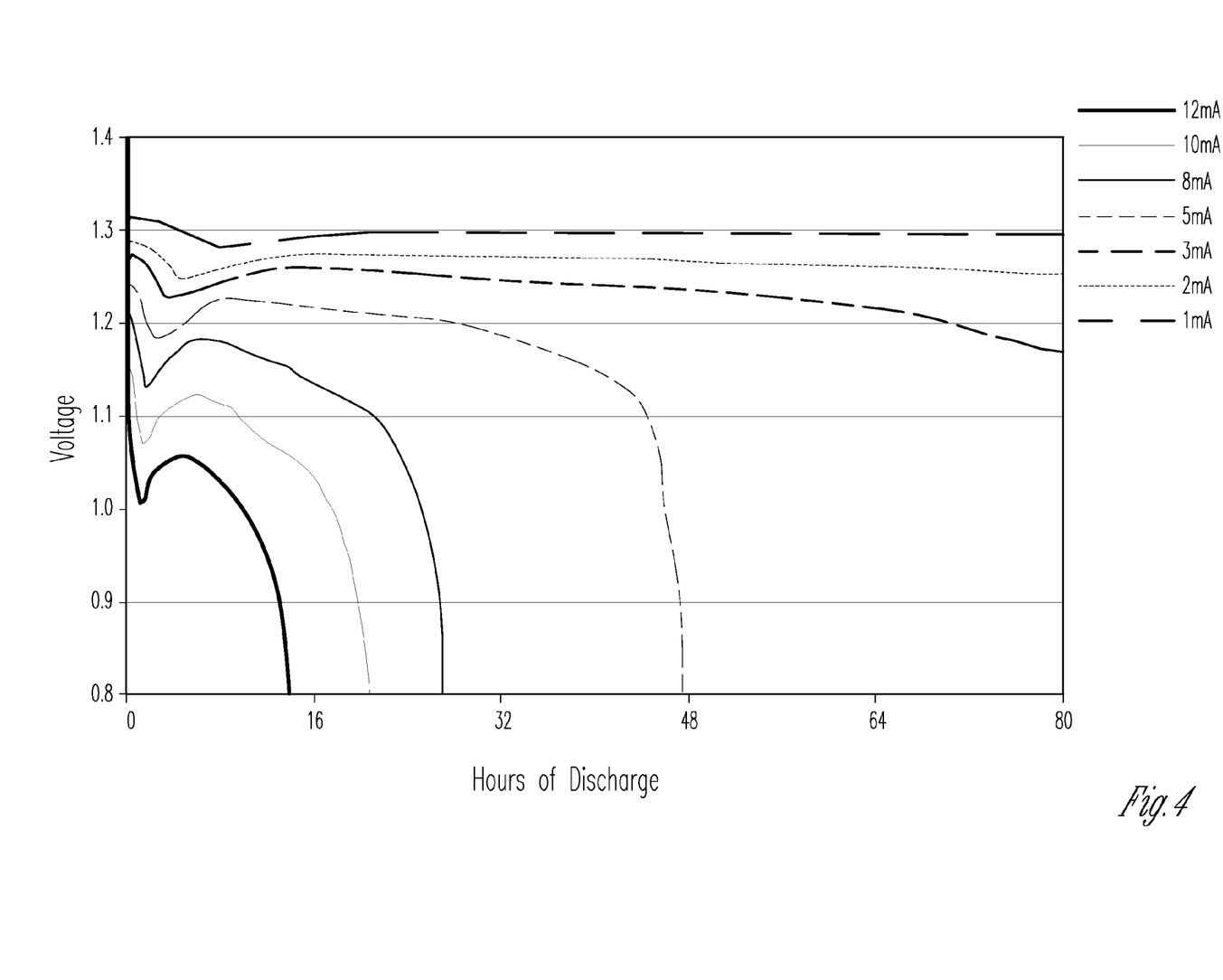
FIG. 4 shows a discharge characteristic of a Zn-Air hearing assistance device battery, according to various embodiments of the present subject matter.
Figure 5:
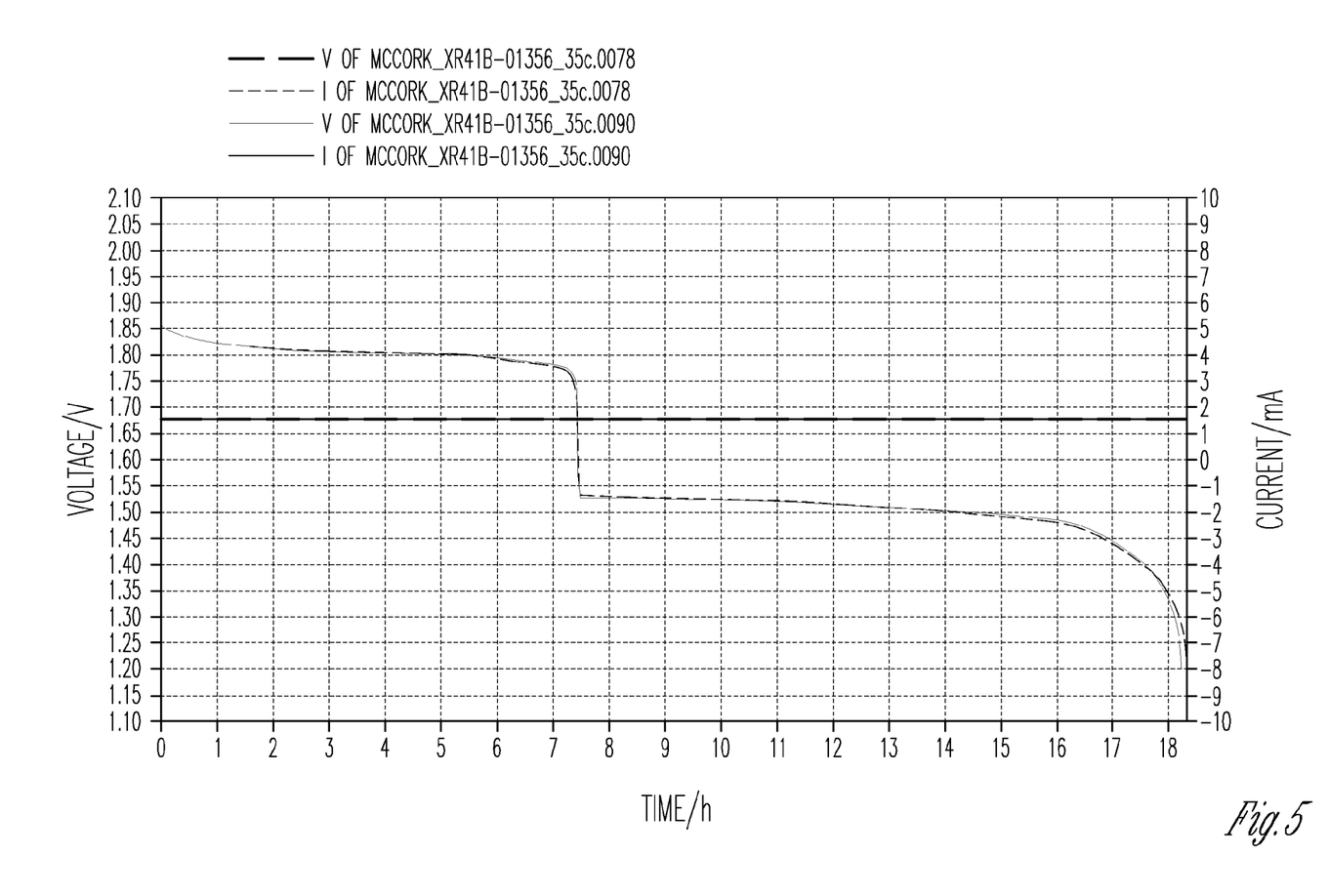
FIG. 5 shows a discharge characteristic of an AgZn hearing assistance device battery, according to various embodiments of the present subject matter.

FIG. 4 shows a discharge characteristic (voltage vs. hours of discharge) of a Zn-Air hearing assistance device battery, according to various embodiments of the present subject matter. FIG. 5 shows a discharge characteristic (voltage vs. hours of discharge) of an AgZn hearing assistance device battery, according to various embodiments of the present subject matter. The Zn-Air battery has a relatively flat characteristic, while the AgZn battery has two plateau levels, the second lower than the first but still higher than the Zn-Air plateau voltage level, in various embodiments.

Various embodiments of the present subject matter provide a hearing assistance device, such as a hearing aid, that is adapted to work with a number of different battery chemistries interchangeably without user intervention. Various battery chemistries include, but are not limited to, Zn-Air, AgZn and Li. In one embodiment, AgZn and Zn-Air chemistry batteries are used, since the cells will be physically identical and have different voltage vs. discharge characteristics. In various embodiments, no voltage regulator is used. In addition to voltage discharge the present subject matter includes some applications for determining battery chemistry or battery type for the purpose of charging the battery. Various embodiments include determining the appropriate power conditioning necessary to render the voltage useful for running the hearing instrument. This may include DC-DC conversion in either a buck or boost mode depending on the battery chemistry or battery type, in various embodiments.

The present subject matter addresses low battery warnings and low battery shutdown conditions, based on determined battery chemistry or battery type. It also addresses methods of voltage conversion based on battery chemistry or battery type as well as methods of charging appropriate for the battery chemistry or battery type based on sensing battery voltage to determine battery chemistry or battery type.

In one embodiment, a hearing assistance device employs two low voltage set points: one to alert the user that the battery is running low; the other to initiate an orderly shutdown when the battery reaches end of life to avoid unpleasant audio artifacts. These set points are different for different battery types or batteries having different chemistries; so the set points must be adjusted automatically by the hearing aid, depending upon which battery is installed and detected by the present subject matter. If this is not done, a possible risk of using Zn-Air parameters for charging AgZn cells for example could lead to the situation where the battery is over-discharged, reducing cycle life, among other things. In addition due to the steep discharge slope at end of life the time between the low battery warning and shutdown will be very short, rendering the warning useless. In addition, using AgZn set points for Zn-Air will result in very short battery life. Since the AgZn has a higher voltage chemistry, the Zn-Air will look like a depleted AgZn. Previous hearing assistance devices have not dealt with this problem, as most products use a single chemistry or multiple chemistries with very similar discharge characteristics, or the whole system operates on a regulated voltage.

The present subject matter can be used to detect the battery chemistry by measuring voltage under load at initialization and adjust the low battery and end-of-discharge set points before audio processing begins, among other adjustments to operating characteristics of the hearing assistance device. This allows multiple battery chemistries to be used in products employing the present subject matter with little or no user intervention. The present subject matter takes advantage of the fact that different battery chemistries can have very different open circuit and lightly loaded voltages over most of their discharge curves. One can use this voltage difference to tell the batteries apart. Other methods, such as impedance measurement and mechanical features (size/shape/special indicating features), may be used in combination with the present subject matter to distinguish battery type or chemistry. The present subject matter includes a voltage under load method that can independently provide a straightforward and reliable method to determine battery chemistry using hardware and software. In various embodiments, the hardware and mechanical design of the hearing aid is not modified provided the device is properly programmed to accomplish the task. In a Lithium battery system, the hearing aid hardware may be used as either a backup to, or replacement for more traditional lithium system protection means. Using AgZn and Zn Air as examples, when loaded at 1 mA or less:

Zn Air=1.4–1V

Ag—Zn=1.85–1.5V

Therefore a detection threshold is set at 1.4V, in one embodiment. In one embodiment using a hearing aid, the method includes:
1. Hearing aid is booted up by inserting battery and closing battery door.
2. Hearing aid boots, but does not turn on audio output stage.
   a. This produces a constant current drain of less than 1 mA.
3. DSP measures battery voltage after a short delay, using an exponential average.
   a. If >1.4V, the cell is AgZn
   b. If ≤1.4V, the cell a Zn-Air installed
4. DSP selects battery warning and shut-down voltages appropriate to the chemistry.
5. An alternate method uses a circuit which prevents the hearing instrument from powering up until the battery voltage is sensed. By harvesting the energy from the battery the voltage can be determined both under load and unloaded to determine the battery chemistry. In this way the sensing circuit can address all types of battery chemistries including LiON rechargeables as well as other rechargeables.
6. Once the battery chemistry is determined the most efficient means of power conversion can be used to adapt the voltage for use in the hearing instrument. Buck or boost, linear regulation, PWM, etc. can be used to most efficiently convert the voltage.
7. Once battery chemistry is determined, the most efficient means of recharging (if a rechargeable type of battery is detected) can be used to control the incoming voltage and current for the purpose of recharging a secondary cell within the hearing instrument.

In some applications it is unknown exactly what type of battery or battery chemistry will be inserted into the hearing assistance device. In some embodiments these steps are repeated at each power on event. In various embodiments, if the system errs, it will be in the direction of mistaking an AgZn cell for a Zn-Air. It could do this if an AgZn battery were near the end of life, typically approaching 1.2V. These voltage levels occur over a very small time window, with voltages typically not dropping below 1.5 V until well along a rapid slope to zero. Although there is the possibility of damaging an AgZn cell through repeated over-discharge, such possibility could be considered to present a low risk. Arguably, a worse situation would be mistaking a Zn-Air battery for an AgZn. In that case, the lower voltage of the Zn-Air would nearly immediately shut down the aid.

The present subject matter can be implemented in a DSP or in an auxiliary chip and communicated to DSP. In one embodiment, CODEC, radio or power amplifier circuits are used in multichip processing systems. Other power management ICs can be used for this function, such as one meant to control charging in an embodiment. In one embodiment, firmware is executed by the DSP at boot using existing onboard battery voltage measurement hardware. In inductive recharge circuits, detection can be done by a power management circuit, such as a power management integrated circuit (PMIC). In various embodiments, the present subject matter allows for hearing devices to be designed to detect at least two battery chemistries. In various embodiments, the present subject matter can be adapted to detect at least the two chemistries illustrated above. In various embodiments. Li-Ion or Li—Po batteries (e.g., at 2.8-4.2 volts when charged) could be easily discriminated, allowing at least 3, if not more chemistries to be selected by a single hearing instrument in various embodiments. The gain and output of the hearing assistance device can be adjusted to allow for Lithium batteries in addition to the abovementioned battery types. The sloping decrease in Lithium voltage is also compensated for in the present subject matter, as well as adjustments for other changes in battery characteristics over load and time.

The present subject matter can be used with open circuit requirements, in various embodiments. In one embodiment, the present subject matter can be used to determine the battery chemistry of a remote battery to determine if the battery is rechargeable before recharging. By determining the battery type, appropriate charging parameters can be used to prevent over or under charging of the battery in various embodiments. In various embodiments, a hearing assistance device includes a direct audio input (DAI) connector, and a rechargeable battery is recharged remotely via the DAI connector. One example of recharging a remote battery is discussed in commonly owned U.S. patent application Ser. No. 11/689,362, "System for Providing Power to a Hearing Assistance Device", which is hereby incorporated by reference in its entirety. The type or chemistry of the remote battery can be sensed to confirm the cell is a rechargeable battery in the hearing assistance device before performing the recharging function, in various embodiments. In addition, after determining battery type or battery chemistry, an efficient means of power conversion can be applied.

Various embodiments of the present subject matter support wireless communications with a hearing assistance device. In various embodiments the wireless communications can include standard or nonstandard communications. Some examples of standard wireless communications include wireless standards/protocols including, but not limited to, Bluetooth™, IEEE 802.11(wireless LANs), 802.15 (WPANs), 802.16 (WiMAX), cellular protocols including, but not limited to CDMA and GSM, ZigBee, and ultra-wideband (UWB) technologies. Some such examples support radio frequency communications and some support infrared communications. Although the present system is demonstrated as a radio system, it is possible that other forms of wireless communications can be used such as ultrasonic, magnetic (induction), optical, and others. It is understood that the standards and protocols which can be used include past and present standards. It is also contemplated that future versions of these standards and protocols and new future standards and protocols may be employed without departing from the scope of the present subject matter.

The wireless communications support a connection from other devices. Such connections include, but are not limited to, one or more mono or stereo connections or digital connections including, but not limited to, 802.3 (Ethernet), 802.4, 802.5, USB, ATM, Fibre-channel, Firewire or 1394, Infini-Band, or a native streaming interface. In various embodiments, such connections include all past and present link protocols. It is also contemplated that future versions of these protocols and new future standards may be employed without departing from the scope of the present subject matter.

It is understood that variations in communications standards, protocols, antenna configurations, and combinations of components may be employed without departing from the scope of the present subject matter. Hearing assistance devices typically include an enclosure or housing, a microphone, hearing assistance device electronics including processing electronics, and a speaker or receiver. Processing electronics include a controller or processor, such as a digital signal processor (DSP), in various embodiments. Other types of processors may be used without departing from the scope of this disclosure. It is understood that in various embodiments the microphone is optional. It is understood that in various embodiments the receiver is optional. Antenna configurations may vary and may be included within an enclosure for the electronics or be external to an enclosure for the electronics. Thus, the examples set forth herein are intended to be demonstrative and not a limiting or exhaustive depiction of variations.

It is understood that the hearing aids referenced in this patent application include a processor. The processor may be a digital signal processor (DSP), microprocessor, microcontroller, other digital logic, or combinations thereof. The processing of signals referenced in this application can be performed using the processor. Processing may be done in the digital domain, the analog domain, or combinations thereof. Processing may be done using subband processing techniques. Processing may be done with frequency domain or time domain approaches. Some processing may involve both frequency and time domain aspects. For brevet, in some examples drawings may omit certain blocks that perform frequency synthesis, frequency analysis, analog-to-digital conversion, digital-to-analog conversion, amplification, and certain types of filtering and processing. In various embodiments the processor is adapted to perform instructions stored in memory which may or may not be explicitly shown. Various types of memory may be used, including volatile and nonvolatile forms of memory. In various embodiments, instructions are performed by the processor to perform a number of signal processing tasks. In such embodiments, analog components are in communication with the processor to perform signal tasks, such as microphone reception, or receiver sound embodiments (i.e., in applications where such transducers are used). In various embodiments, different realizations of the block diagrams, circuits, and processes set forth herein may occur without departing from the scope of the present subject matter.

The present subject matter can be used for a variety of hearing assistance devices, including but not limited to, cochlear implant type hearing devices, hearing aids, such as behind-the-ear (BTE), in-the-ear (ITE), in-the-canal (ITC), or completely-in-the-canal (CIC) type hearing aids. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the user. Such devices are also known as receiver-in-the-canal (RIC) or receiver-in-the-ear (RITE) hearing instruments. It is understood that other hearing assistance devices not expressly stated herein may fall within the scope of the present subject matter.

This application is intended to cover adaptations or variations of the present subject matter. It is to be understood that the above description is intended to be illustrative, and not restrictive. The scope of the present subject matter should be determined with reference to the appended claims, along with the full scope of legal equivalents to which such claims are entitled.

What is claimed is:

1. A method of operating a hearing assistance device having a battery, the method comprising:
    detecting voltage of the battery at a predetermined load current;
    preventing the hearing assistance device from powering up before the battery voltage is detected;
    determining battery type based on detected voltage; and
    adjusting an operating parameter of the hearing assistance device based on determined battery type, the adjusting configured to reduce degradation in hearing assistance functions dependent on unregulated battery voltage.

2. The method of claim 1, wherein detecting voltage of the battery at a predetermined load current includes detecting voltage of the battery at a load current of approximately 1 mA.

3. The method of claim 1, wherein detecting voltage of the battery at a predetermined load current includes detecting voltage of the battery at a load current of less than approximately 1 mA.

4. The method of claim 1, wherein detecting voltage of the battery at a predetermined load current includes detecting voltage of the battery at an open circuit.

5. The method of claim 1, wherein adjusting an operating parameter includes adjusting gain of the hearing assistance device.

6. The method of claim 1, wherein adjusting an operating parameter includes adjusting a feedback cancellation (FBC) filter of the hearing assistance device.

7. The method of claim 1, wherein adjusting an operating parameter includes adjusting self-diagnostic thresholds of the hearing assistance device.

8. The method of claim 1, wherein adjusting an operating parameter includes adjusting indicator loudness of the hearing assistance device.

9. The method of claim 1, wherein adjusting an operating parameter includes adjusting a low battery set point of the hearing assistance device.

10. The method of claim 1, wherein adjusting an operating parameter includes adjusting an end-of-discharge battery set point of the hearing assistance device.

11. The method of claim 1, further comprising preventing the hearing assistance device from powering up until the battery type is determined.

12. The method of claim 1, wherein determining battery type includes determining whether the battery is rechargeable.

13. The method of claim 12, further comprising charging the battery if it is determined to be rechargeable.

14. The method of claim 12, further comprising selecting parameters for recharging the battery based on the determined battery type.

15. The method of claim 1, further comprising selecting parameters for power conversion based on the determined battery type.

16. The method of claim 1, wherein determining battery type includes determining the battery is a Zn-Air battery.

17. The method of claim 1, wherein determining battery type includes determining the battery is an Ag—Zn battery.

18. The method of claim 1, wherein determining battery type includes determining the battery is a NiMH battery.

19. The method of claim 1, wherein determining battery type includes determining the battery is a Lithium battery.

20. A hearing assistance device, comprising:
a microphone;
hearing assistance electronics connected to the microphone;
a receiver connected to the hearing assistance electronics; and
a battery connected at least to the hearing assistance electronics,
wherein the hearing assistance electronics include a digital signal processor (DSP) configured to detect voltage of the battery at a predetermined load current, prevent the hearing assistance device from powering up before the battery voltage is detected, determine battery type based on the detected voltage, and adjust an operating parameter of the hearing assistance device based on the determined battery type to reduce degradation in hearing assistance functions dependent on unregulated battery voltage.

21. The device of claim 20, wherein the battery is a Zn-Air battery.

22. The device of claim 20, wherein the battery is an Ag—Zn battery.

23. The device of claim 20, wherein the battery is a NiMH battery.

24. The device of claim 20, wherein the battery is a Lithium battery.

25. The device of claim 20, wherein the hearing assistance device includes a hearing aid.

26. The device of claim 25, wherein the hearing aid includes a behind-the-ear (BTE) hearing aid component.

27. The device of claim 25, wherein the hearing aid includes an in-the-ear (ITE) hearing aid component.

28. The device of claim 25, wherein the hearing aid includes an in-the-canal (ITC) hearing aid component.

* * * * *

UNITED STATES PATENT AND TRADEMARK OFFICE
CERTIFICATE OF CORRECTION

PATENT NO. : 9,113,276 B2  
APPLICATION NO. : 13/707409  
DATED : August 18, 2015  
INVENTOR(S) : Kill et al.

Page 1 of 1

It is certified that error appears in the above-identified patent and that said Letters Patent is hereby corrected as shown below:

On the Title Page

Item (72) Inventors, should read:  
--(72) Inventors: Howard Kill, Eden Prairie, MN (US);  
James R. Newton, Burnsville, MN (US);  
Zheng Yan, Eden Prairie, MN (US);  
Harikrishna P. Natarajan, Shakopee, MN (US); Troy W. Renken, Alpharetta, GA (US); Timothy W. Powers, Thousand Oaks, CA (US)--.

Signed and Sealed this  
First Day of January, 2019

Andrei Iancu  
*Director of the United States Patent and Trademark Office*